United States Patent
Michael (10) Patent No.: US 7,149,939 B2
(45) Date of Patent: Dec. 12, 2006

(54) METHOD OF TESTING THE DATA EXCHANGE FUNCTIONALITY OF A MEMORY

(75) Inventor: Ewald Michael, Rosenheim (DE)

(73) Assignee: Infineon Technologies AG, Munich (DE)

( * ) Notice: Subject to any disclaimer, the term of this patent is extended or adjusted under 35 U.S.C. 154(b) by 468 days.

(21) Appl. No.: 10/134,023

(22) Filed: Apr. 26, 2002

(65) Prior Publication Data
US 2003/0005373 A1    Jan. 2, 2003

(30) Foreign Application Priority Data
Apr. 27, 2001 (DE) ................ 101 20 668

(51) Int. Cl.
G11C 29/00 (2006.01)
G06F 11/00 (2006.01)
G01R 31/028 (2006.01)

(52) U.S. Cl. .............. 714/719; 714/733; 714/738
(58) Field of Classification Search ........... 714/724, 714/731, 733, 738, 718, 719, 720, 723, 709, 714/710; 365/200, 201
See application file for complete search history.

(56) References Cited

U.S. PATENT DOCUMENTS

| | | | | |
|---|---|---|---|---|
| 5,818,772 A | * | 10/1998 | Kuge | 365/201 |
| 6,092,225 A | * | 7/2000 | Gruodis et al. | 714/724 |
| 6,557,128 B1 | * | 4/2003 | Turnquist | 714/724 |
| 6,681,359 B1 | * | 1/2004 | Au et al. | 714/733 |

FOREIGN PATENT DOCUMENTS

DE        197 49 240 A1        5/1999

* cited by examiner

Primary Examiner—James C. Kerveros
(74) Attorney, Agent, or Firm—Jenkins, Wilson, Taylor & Hunt, P.A.

(57) ABSTRACT

Method of testing the functionality of a memory which operates at a high operating clock frequency, the method specifically having the following steps, generation of test data, copying of the generated test data at the high operating clock frequency, comparison of the copied test data with the generated test data, generation of a functionality-indicating signal for indicating the functionality of the memory if the copied test data are identical to the generated test data.

12 Claims, 12 Drawing Sheets

METHOD OF TESTING THE DATA EXCHANGE FUNCTIONALITY OF A MEMORY

This application claims the benefit of German application no. 101 20 668.2, filed Apr. 27, 2001, currently pending.

FIELD OF THE INVENTION

The invention relates to a method of testing the data exchange functionality of a synchronous memory which operates at a high operating clock frequency.

BACKGROUND OF THE INVENTION

Figure 1:
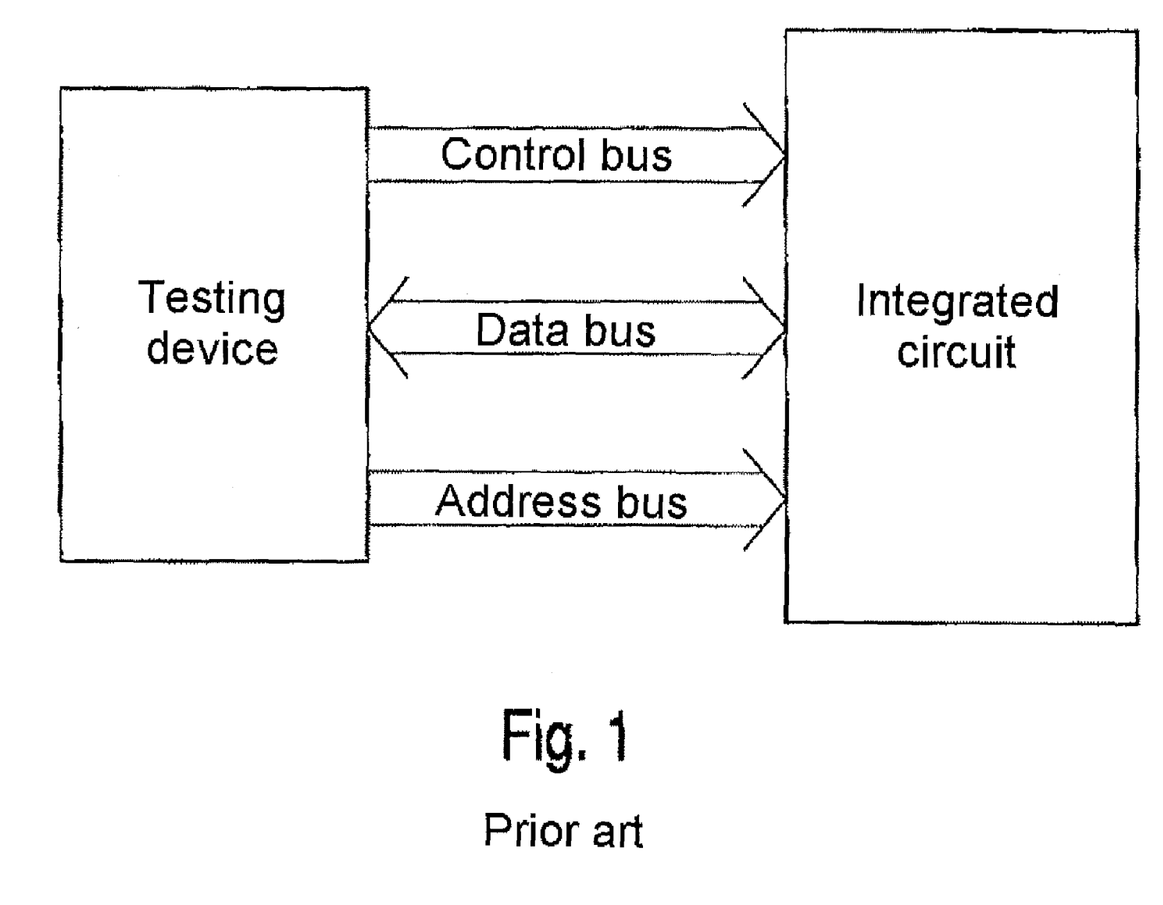
FIG. 1 shows a prior-art testing arrangement.

The functional testing of high-performance memory chips requires corresponding testing systems for the production of these memory chips. FIG. 1 shows a prior-art testing arrangement. An external testing device is connected via a control bus, a data bus and an address bus to an integrated memory chip and tests the functionality of the latter.

The external testing device addresses the memory cells to be tested within the integrated memory circuit and applies generated test patterns to the addressed memory cells via the data bus. Control signals for activating the integrated memory chip, such as read and write commands for example, are transmitted from the testing device via the control bus to the integrated memory chip. The test data written into the memory cells is subsequently read out again via the data bus and compared in the testing device with the originally generated test data, for checking the functionality of the memory cells contained in the integrated memory circuit, and evaluated. The higher the requirements imposed on the integrated memory circuits, the higher too the demands and capability of the external testing device for testing the memory chip. In many cases, no testing devices that have the required range of capabilities are available by the time production of the memory chips begins.

Figure 2:
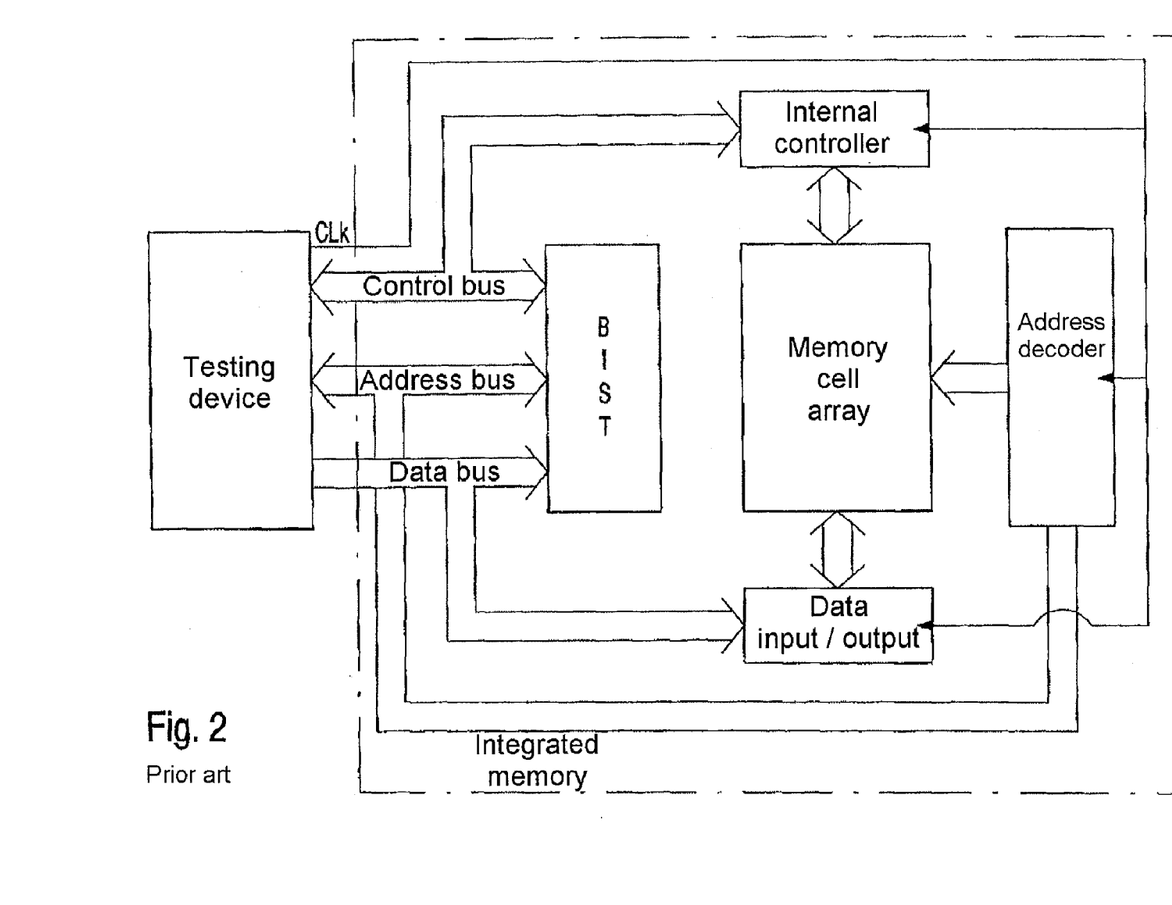
FIG. 2 shows an integrated memory chip with an inbuilt self-testing circuit for testing the functionality of addressable prior-art memory cells.

Therefore, integrated memory chips which have an inbuilt self-testing function to relieve the external testing device have been developed. FIG. 2 shows a prior-art memory chip with an integrated self-testing function BIST (BIST: Built-In Self-Test). In this case, the integrated self-testing circuit is likewise connected to the external testing device via the control bus, the data bus and the address bus. The address bus is also connected to an address decoder for the addressing of the memory area contained in the memory cell array, while the data bus is additionally connected to a data input/output management, which carries out the signal adaptation.

Figure 3:
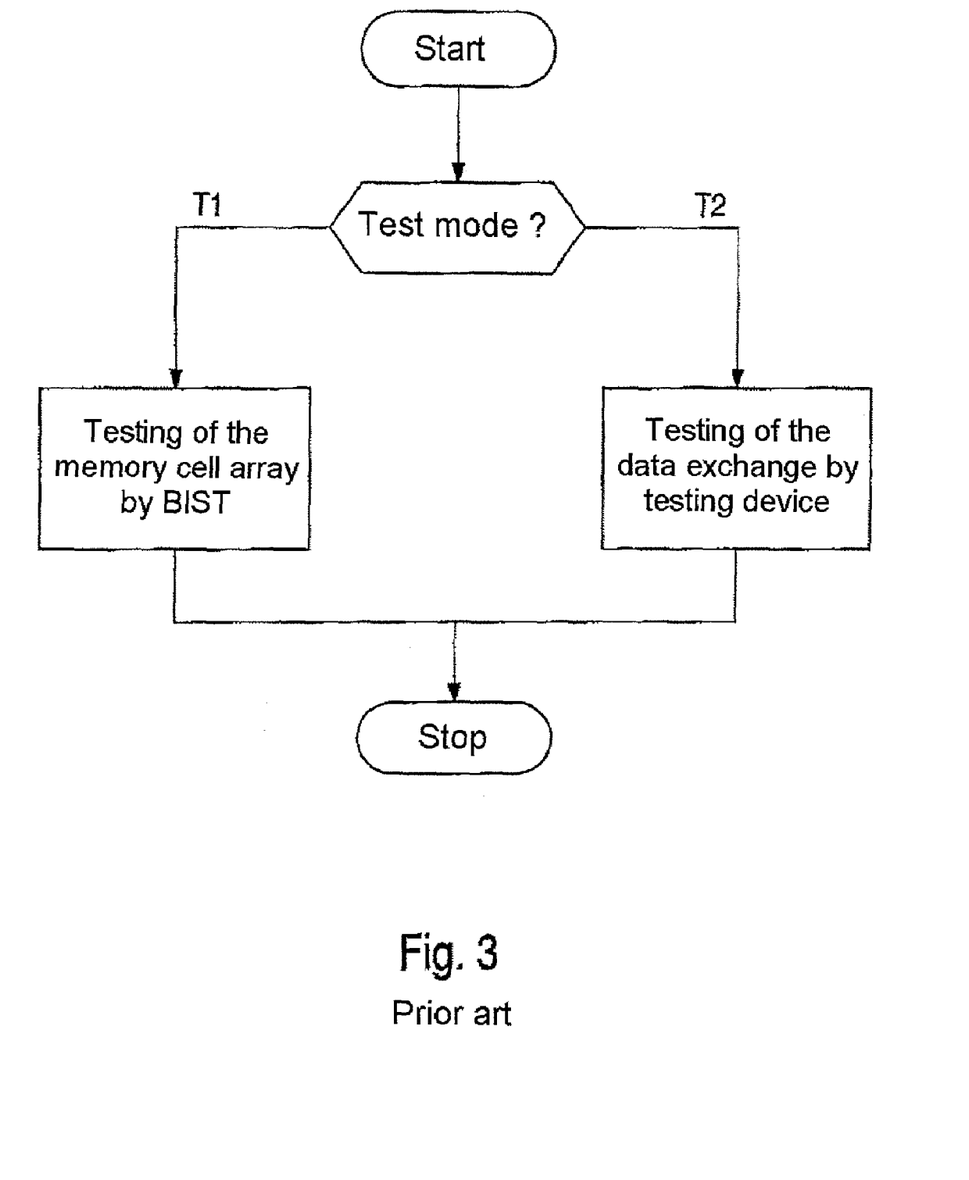
FIG. 3 shows a sequence diagram for explaining a prior-art test procedure.
Figure 4:
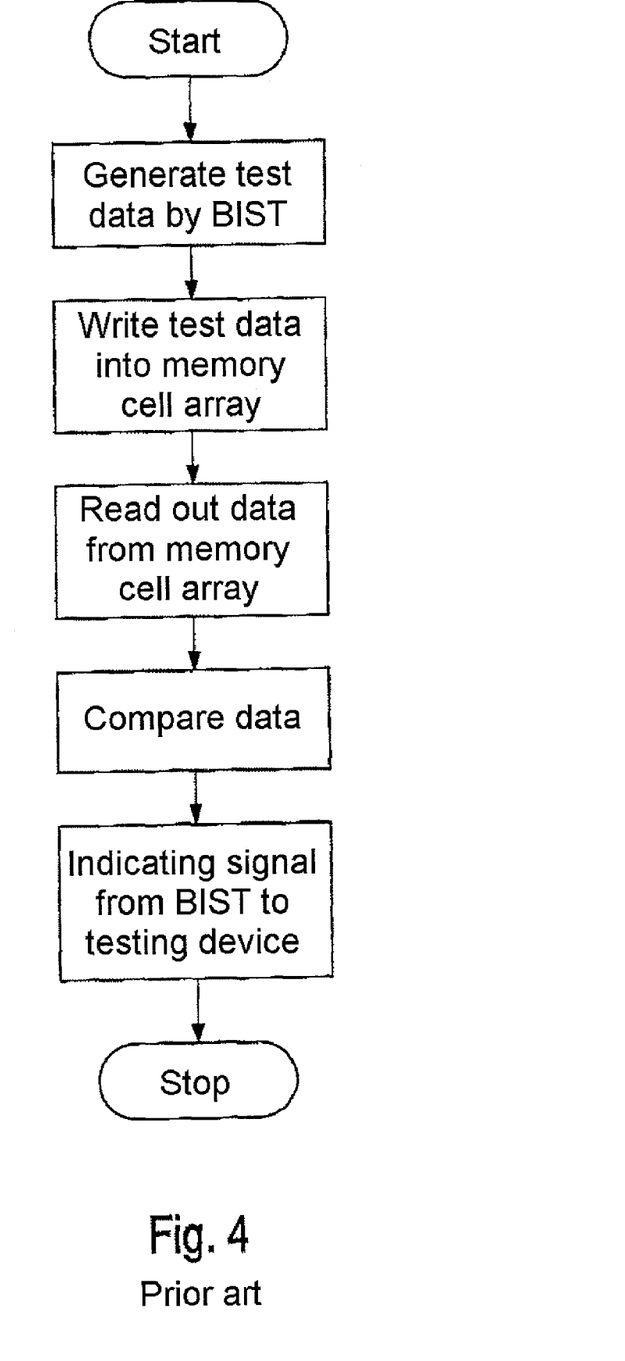
FIG. 4 shows a further sequence diagram for explaining a test procedure for testing a prior-art memory cell array.

FIG. 3 schematically shows how the prior-art integrated memory chip represented in FIG. 2 is tested. In one test operating mode, it is decided whether the test concerned is a test of the functionality of the memory cells within the memory cell array or a test of the data exchange functionality of the entire integrated memory chip. The test of the functionality of the memory cell array is performed under the control of the inbuilt self-testing circuit, which generates the addresses of memory cells to be addressed within the memory cell array and applies them to the address decoder via the address bus. In addition, the internal self-testing circuit generates test data patterns, which are written into the addressed memory cells of the memory cell array via the internal data bus and the data input/output circuit. Subsequently, the data are read out from the addressed memory cells and evaluated by the integrated self-testing circuit with the generated test data patterns to evaluate the functionality of the memory cell array. The integrated self-testing circuit BIST subsequently informs the external testing device about the functionality of the memory cell array.

In a further test operating mode, the data exchange functionality of the entire integrated memory chip is tested, this being performed by the external testing device. In this case, the communication of the integrated memory chip with an external circuit is tested. For example, it is tested whether the signal connections and driver circuits of the integrated memory chip are functional and whether the memory chip is capable of communicating with external circuits. The test of the data exchange functionality of the memory chip is in this case performed under the control of the external testing device. Since modern memory chips operate at ever higher operating clock frequencies, the data exchange functionality of the integrated memory chip must likewise be carried out by the external testing device at a very high data transfer rate. The requirements imposed on the external testing device for testing the data exchange functionality of the high-performance memory chip are therefore likewise very high, so that correspondingly complex, expensive external testing devices have to be used. To some extent, highly complex testing devices of this type for the testing of high-performance memory chips are not available for testing the data exchange functionality of the memory chip in the case of new developments.

The object is therefore to provide a method of testing the integrated memory chip in which the data exchange functionality of the memory chip can be reliably tested with a conventional testing device which operates at a relatively low operating clock frequency and of providing an integrated synchronous memory which can be reliably tested with a conventional testing device.

SUMMARY OF THE INVENTION

This object is achieved according to the invention by a method with the features specified in patent claim 1 and by an integrated synchronous memory with the features specified in patent claim 10.

The invention provides a method of testing the data exchange functionality of a memory which operates at a high operating clock frequency, the method specifically comprising the following steps:

generation of test data, copying of the test data at the high operating clock frequency, comparison of the copied test data with the generated test data, generation of a functionality-indicating signal for indicating the data exchange functionality of the memory if the copied test data are identical to the generated test data.

In a preferred embodiment of the method according to the invention, first test data are generated by a test-data generator within an external testing device and are written at a low clock frequency into at least one reference memory, the first test data, written into the reference memory, being copied at the high operating clock frequency into at least one memory to be tested, associated with the reference memory, and the copied first data being read out from the memory to be tested at the low clock frequency by the external testing device, and the generated first test data being compared by the external testing device with the copied first test data read out from the memory to be tested.

In a preferred embodiment of the method according to the invention, second test data are generated by the test-data generator within the external testing device and are written at the low clock frequency into at least one memory to be tested, the second test data, written into the memory to be tested, being copied at the high operating clock frequency into at least one associated reference memory, the copied second data being read out from the reference memory at the low clock frequency by the external testing device, and the generated second test data being compared by the external testing device with the copied second test data read out from the reference memory.

In a particularly preferred embodiment of the method according to the invention, the function-indicating signal for indicating the data exchange functionality of the memory to be tested is generated if the generated first test data are identical to the first test data copied from the memory to be tested, read out from the memory to be tested, and the generated second test data are identical to the second test data copied from the reference memory, read out from the reference memory.

In a further embodiment of the method according to the invention, the test data are generated by an internal test-data generator within a reference memory, the generated test data being copied from the reference memory at the high operating clock frequency into at least one associated memory to be tested, and the test data copied in the memory to be tested being copied back at the high operating clock frequency into the reference memory, the test data generated by the test-data generator being compared with the copied-back test data by a comparison circuit within the reference memory.

In this case, the comparison circuit within the reference memory preferably emits a function-indicating signal for indicating the data exchange functionality of the memory to be tested to an external testing device if the generated test data and the copied-back test data are identical.

In a further embodiment of the method according to the invention, the test data are generated by an internal test-data generator within the integrated memory to be tested, the generated test data being copied at the high operating clock frequency into a first memory area of the memory to be tested, the copied test data being copied at the high operating clock frequency out of the first memory area of the memory to be tested into a second memory area of the memory to be tested, and the test data copied in the second memory area being read out and compared with the generated test data by a comparison circuit within the memory to be tested.

In this case, the comparison circuit within the memory to be tested preferably emits a function-indicating signal for indicating the data exchange functionality of the memory to be tested to an external testing device if the generated test data are identical to the copied test data read out from the second memory area.

In a preferred embodiment of the method according to the invention, the test data are preferably delayed by adjustable delay times.

The invention also provides an integrated synchronous memory with a multiplicity of addressable memory cells, which can be connected to an external circuit, with a first self-testing circuit, for testing the functionality of the addressable memory cells, and with a second self-testing circuit, for testing the functionality of the high-frequency data exchange of the addressable memory cells with the external circuit.

Preferred embodiments of the method according to the invention of testing the exchange functionality of a memory and of the integrated synchronous memory according to the invention are described below with reference to the attached figures for explaining features essential for the invention.

DETAILED DESCRIPTION OF THE PREFERRED EMBODIMENTS

Figure 5:
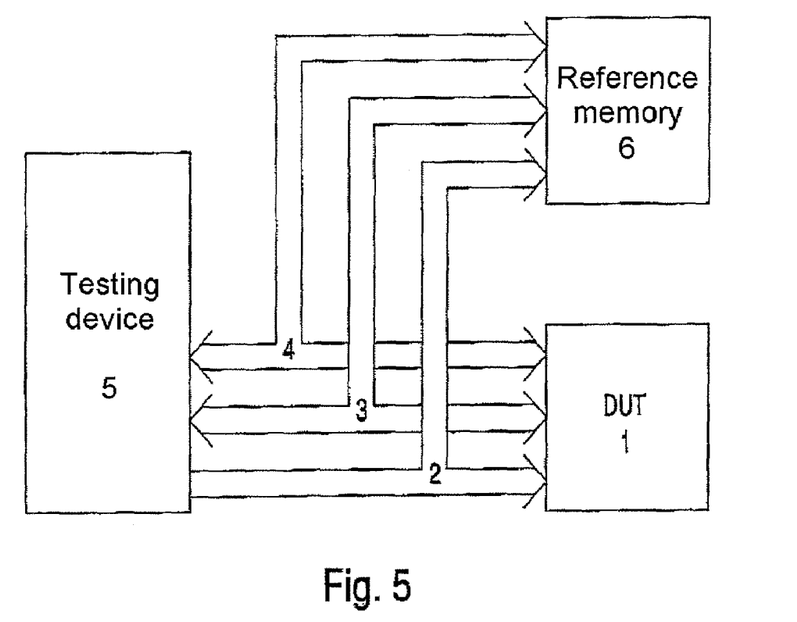
FIG. 5 shows a block diagram for explaining a first embodiment of the test method according to the invention.

FIG. 5 shows a testing arrangement according to the invention. A memory 1 to be tested is connected to an external testing device 5 via an address bus 2, a data bus 3 and a control bus 4. Additionally connected to the address bus 2, the data bus 3 and the control bus 4 is a reference memory. The reference memory 6 is identical in terms of circuitry to the memory 1 to be tested. The functionality of the reference memory 6, i.e. the functionality of the memory cells contained therein and the data exchange functionality of the reference memory 6, is ensured, for example by the previous test procedure. The memory 1 to be tested and the reference memory 6 are high-performance memory chips which operate at a very high operating clock frequency. The testing device 5 is a conventional testing device which operates at a relatively low clock frequency.

For testing the data exchange functionality of the memory 1 to be tested, the following procedure is followed in the case of the testing arrangement 5. Firstly, first test data are generated by a test-data generator within the testing device 5 and are written from the testing device 5 via the data bus 3 at a low data transfer rate or clock frequency into memory cells of the reference memory 6, which are addressed by the testing device 5 via the address bus 2. For this purpose, the testing device 5 emits a control command via the control bus 4 to the reference memory 6.

Subsequently, the reference memory 6 is switched by the external testing device 5 via the control bus 4 into a reading operating mode, and the memory 1 to be tested is switched into a writing operating mode. Subsequently, the first test data are copied the high operating clock frequency at which both the reference memory 6 and the high-performance memory chip 1 to be tested operates, via the data bus 3 from the memory cell array of the reference memory 6 into the memory cell array of the memory chip 1 to be tested. The data are copied for example at a data transfer rate of, for example, 500 MHz.

In a further step, the memory chip 1 to be tested is switched by the external testing device 5 into a reading operating mode and the reference memory 6 is switched into a standby operating mode. The first test data, copied into the memory 1 to be tested, are read out of the memory chip 1 at a low clock frequency by the external testing device 5 and subsequently compared with the originally generated first test data in the external testing device 5. If the originally generated test data and the test data read out from the memory circuit to be tested deviate from one another, the testing device 5 detects that the memory chip 1 to be tested is defective.

If, conversely, the originally generated first test data are identical to the read-out test data, a further copying operation takes place. For this purpose, new test data or second test data are generated by the test-data generator within the external testing device 5 and written at the low clock frequency into the memory chip 1 to be tested. The memory chip 1 to be tested is subsequently switched into a reading operating mode by the testing device 5, and the written-in second test data are copied into the associated reference memory 6 at the high operating clock frequency. Subsequently, the reference memory is switched by the testing device 5 via the control bus 4 into a reading operating mode, and the memory chip 1 to be tested is switched into a standby operating mode. The copied second test data are read out from the reference memory 6 at the low clock frequency by the external testing device 5, and the originally generated second test data are compared by the external testing device 5 with the copied second test data read out from the reference memory 6. If the originally generated second test data are identical to the copied second test data, the testing device 5 detects that the memory chip to be tested is functioning faultlessly. If the originally generated second test data are not identical to the copied second test data, the testing device detects that the memory chip 1 to be tested is defective.

In the procedure described, two operations for copying test data at the high operating clock frequency of the test chip 1 to be tested are performed, that is once from the reference memory 6 to the memory chip 1 and an operation for copying test data from the memory chip 1 to the reference memory 6. If both copying operations are successfully concluded, so that the generated test data are identical to the copied test data, this means that the memory chip 1 to be tested is functional.

In this case, the method according to the invention ensures that the memory chip 1 tested in such a way is fully functional both with regard to the functionality of the memory cells arranged therein and with regard to a data exchange functionality. The testing arrangement according to the invention simultaneously tests the data exchange functionality of the memory chip 1 to be tested by the copying operations at high operating clock frequency, without the data exchange functionality having to be performed in separate further test steps after the testing of the memory cell array has been performed. As a result, the test procedure is speeded up considerably, and consequently the costs of testing are lowered.

Figure 6:
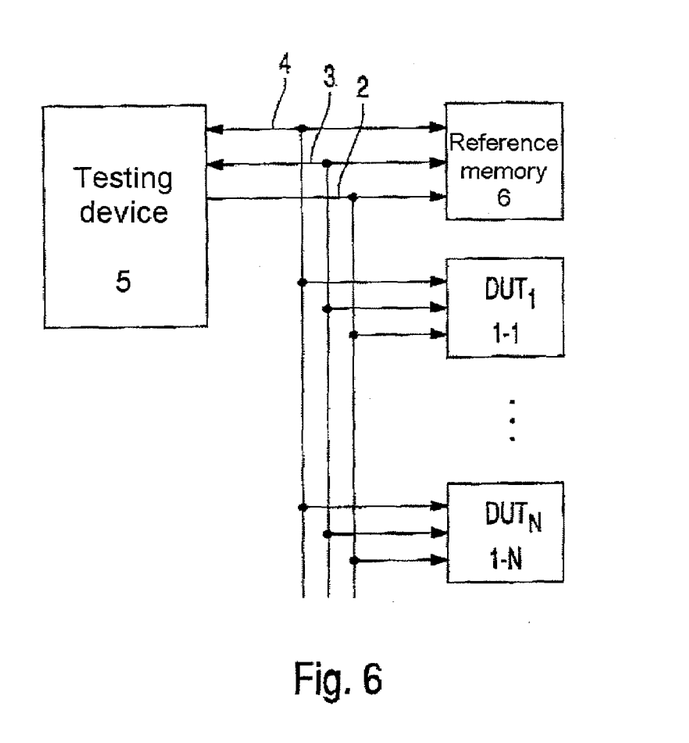
FIG. 6 shows a block diagram of an extended testing arrangement for explaining the first embodiment of the test method according to the invention.

FIG. 6 shows a further testing arrangement according to the invention, in which a plurality of memory chips to be tested are assigned to a reference memory 6. The testing arrangement according to the invention shown in FIG. 6 offers the advantage that a plurality of memory chips 1 can be tested at the same time, whereby the test times can be further reduced. In this respect, there are two possibilities.

In the case of the first possibility, each memory chip 1—1 to 1-N to be tested, which are assigned to a reference memory 6, is tested for their functionality one after the other by two test-data copying operations following one after the other, and their evaluation.

In the case of an alternative possibility, the test data are copied from the reference memory 6 to the first memory chip 1—1 to be tested, and from the latter to further memory chips 1-2, 1-3, . . . , 1-N to be tested, and subsequently evaluated by the testing device 5. If the testing device 5 detects a deviation between the originally generated test data and the multiply copied test data, the testing device 5 detects that one of the memory chips to be tested is defective.

If, after the multiple copying operation, the originally generated test data are identical to the copied test data, the copying operation is performed in the reverse sequence from one memory operation 1-N to be tested to one memory chip 1-N-1 . . . and finally to the reference memory 6. If, even after this multiple second copying operation, the originally generated second test data are identical to the copied second test data, the external testing device 5 detects that all the memory chips 1—1 to 1-N which are assigned to this reference memory 6 are functional. The testing arrangement shown in FIG. 6 can be extended in a further embodiment, by providing a plurality of reference memories 6 with associated memory chips to be tested. For example, eight reference memories 6, with in each case eight assigned memory chips 1 to be tested, may be provided to the testing device 5, so that 64 memory chips 1 can be tested at the same time in one testing stage.

Figure 7:
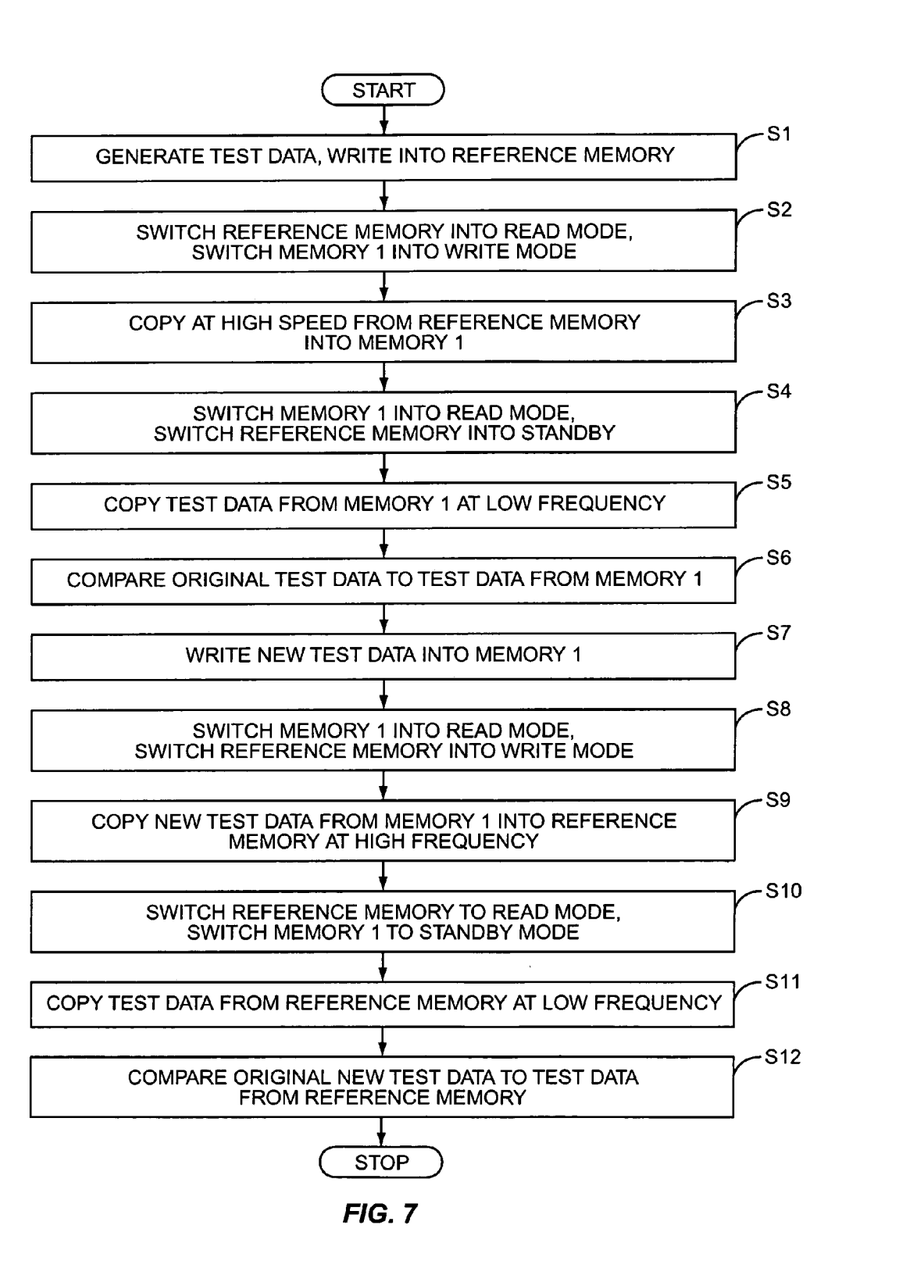
FIG. 7 shows a sequence diagram of a first embodiment of the method according to the invention of testing the data exchange functionality of a memory.

FIG. 7 shows a sequence diagram of a first embodiment of the method according to the invention.

In step S1, test data are generated by the external testing device 6 and are written at a low clock frequency of the testing device 5 into the memory cell array of the reference memory 6 via the data bus 3.

In step S2, the reference memory 6 is switched by the external testing device into a reading operating mode and the memory chip 1 to be tested is switched into a writing operating mode.

In a step S3, the first test data, written into the reference memory 6, are transferred or copied via the data bus at the high operating clock frequency of, for example, 500 MHz into the memory cell array of the memory chip 1 to be tested.

In a step S4, the memory chip 1 to be tested is switched into a reading operating mode and the associated reference memory 6 is switched into a standby operating mode.

In step S5, the copied first test data are read out from the memory chip 1 at the low clock frequency by the testing device 5.

Subsequently, in a step S6, a data comparison of the originally generated first test data and the read-out data is performed, it being detected by the test device 5 that the memory chip 1 is defective if there is a data deviation.

If, in the converse case, the first copying operation has been successfully completed, new test data are written from the testing device 5 into the memory chip 1 in a step S7.

Subsequently, in a step S8, the memory chip 1 to be tested is put into a reading operating mode and the reference memory 6 is switched by the testing device into a writing operating mode.

In a step S9, the second test data, written into the memory chip 1, are copied out of the latter at the high operating clock frequency, and consequently with a high performance, into the reference memory 6.

In a step S10, the reference memory 6 is subsequently switched into a reading operating mode and the memory chip 1 to be tested is switched into a standby operating mode by the testing device 5.

In a step S11, the copied second test data are read out from the reference memory 6 by the testing device 5 at the low clock frequency.

Subsequently, in a step S12, the copied second test data are compared with the originally generated second test data by the testing device 5.

If the second copying operation is also successful, i.e. the copied second test data are identical to the originally generated second test data, the testing device 5 establishes the functionality of the memory chip 1. The established functionality comprises both the functionality of the memory cell array within the memory chip 1 to be tested and the capability of the latter to communicate with the outside world or its data exchange functionality.

It is consequently possible by the method according to the invention to test both the functionality of the memory cell array and the data exchange functionality in one test procedure with a conventional testing device, the clock frequency of which lies far below the operating clock frequency of the high-performance memory chip 1 to be tested. In this case, given a corresponding testing arrangement, a plurality of high-performance memory chips 1 can be tested at the same time by a testing device 5 in one test procedure.

In a preferred embodiment of the method according to the invention, the test data are copied delayed an adjustable delay time. This makes it possible to vary signal parameters of the data read in and out, for setting the specification limit values of the memory chip to be tested.

Figure 8A:
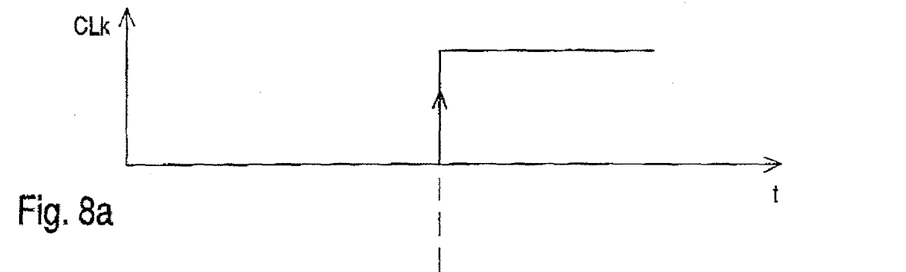
FIGS. 8a to 8c show signal-time sequence diagrams for explaining the testing of set-up times.
Figure 8B:
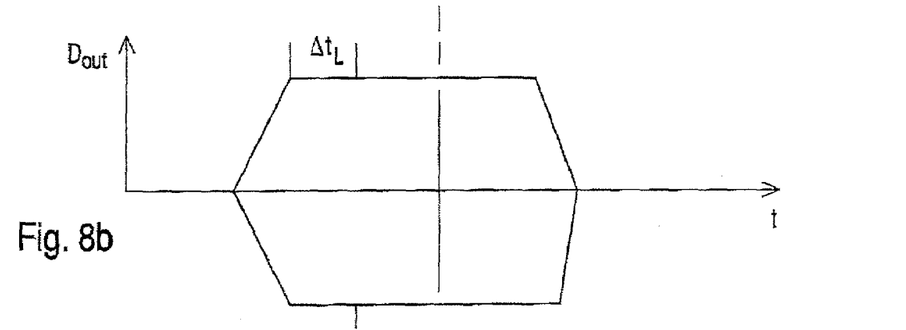
Figure 8C:
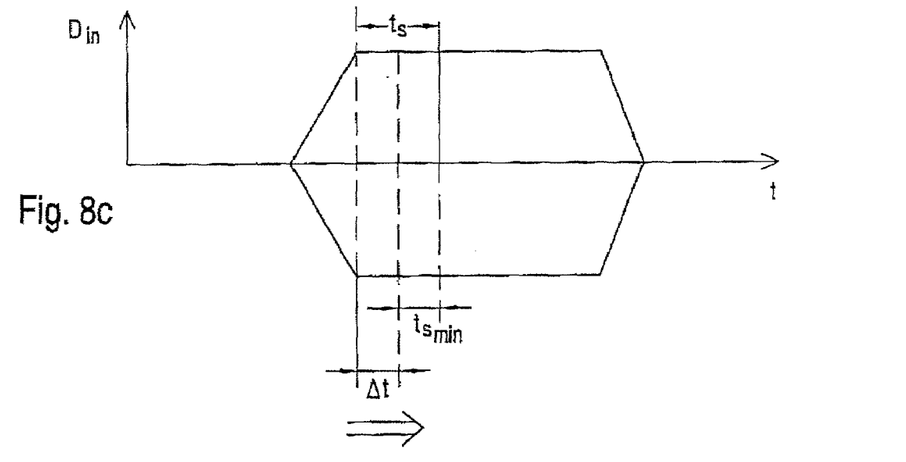

FIG. 8 shows time sequence diagrams for testing set-up times at the memory chip 1 to be tested. As represented in FIG. 8b, the data read out from the reference memory are applied to the memory chip 1 to be tested with a certain time delay through the data line. In this case, the data are preferably delayed by an adjustable delay time Δt corresponding to the specifications of the memory chip 1 to be tested, in order to test critically a minimal set-up time tsmin.

Figure 9A:
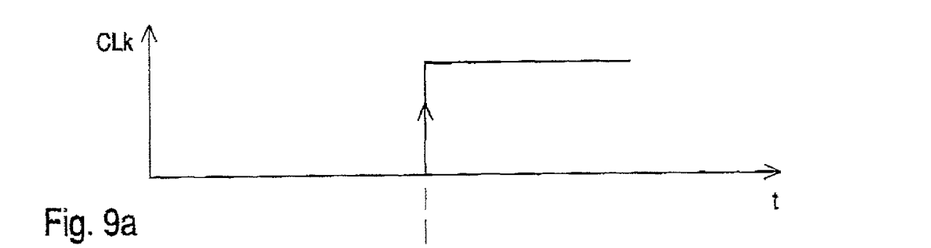
FIGS. 9a to 9c show time sequence diagrams for explaining the testing of holding times.
Figure 9B:
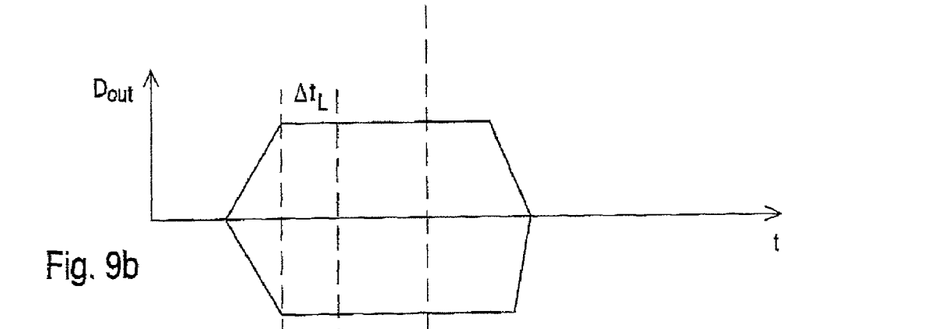
Figure 9C:
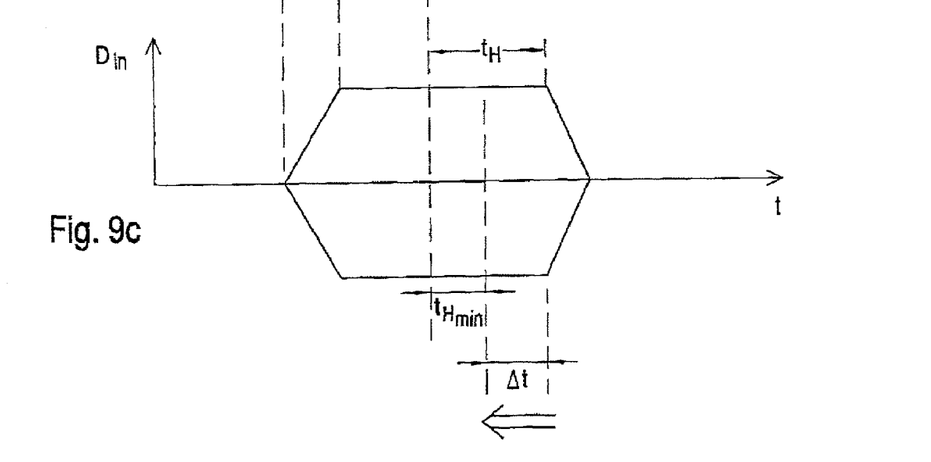

FIG. 9 shows time sequence diagrams for testing the holding time of the memory chip to be tested. The data read out from the reference memory are applied with a time delay $\Delta t_L$ to the memory chip 1 to be tested, so that the holding time $t_h$ represented in FIG. 9c is obtained. This holding time is shifted or delayed by one clock cycle by means of an adjustable delay time, so that the minimal holding time $t_{hmin}$ of the memory chip to be tested is critically tested.

Figure 10:
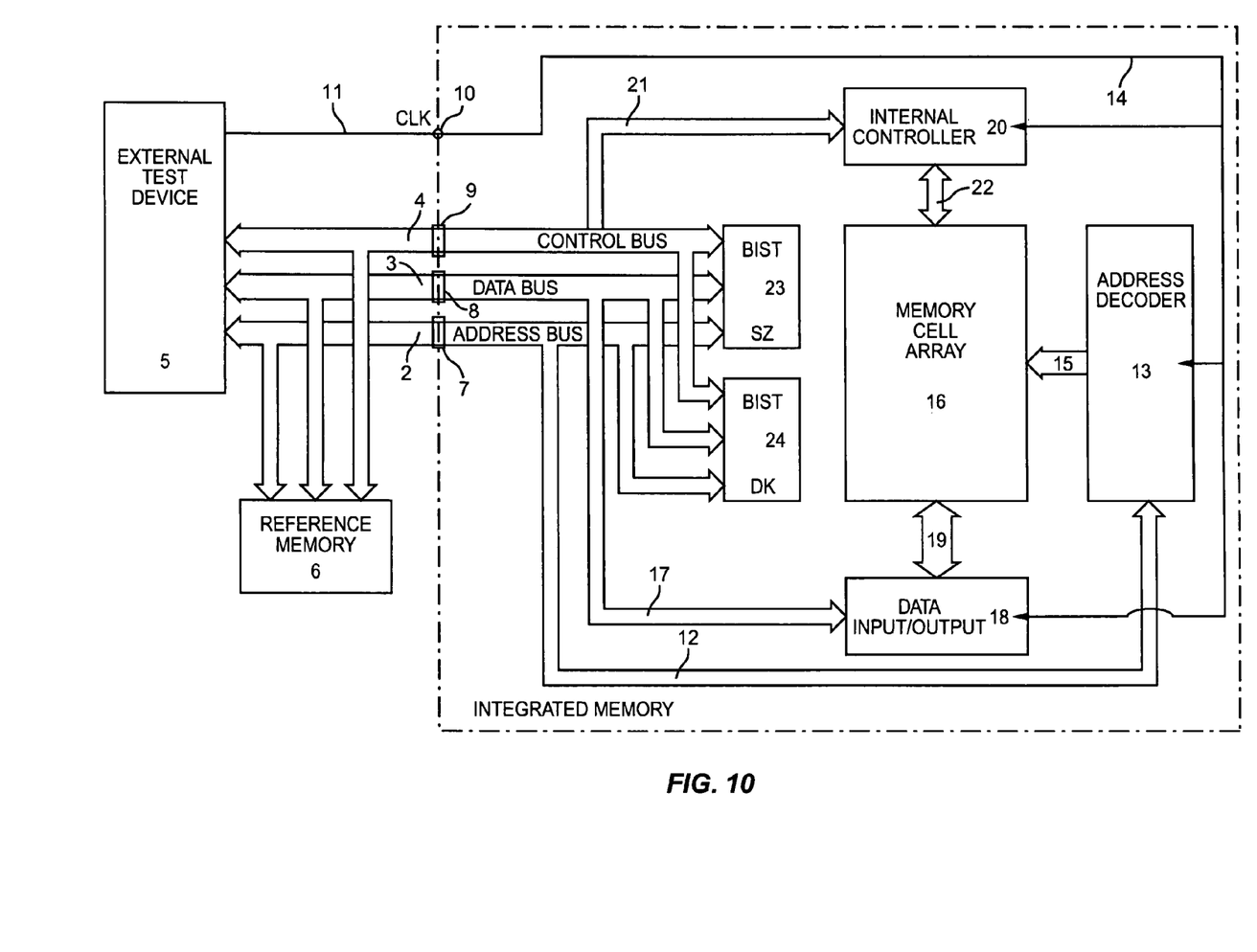
FIG. 10 shows a block diagram of a preferred embodiment of a synchronous memory according to the invention with a self-testing capability.

FIG. 10 shows a preferred embodiment of an integrated synchronous memory 1 according to the invention. In the case of the preferred embodiment of the integrated synchronous memory 1 represented in FIG. 10, said memory has inbuilt self-testing circuits. In the case of the first testing arrangement represented in FIG. 5, the memory chip 1 to be tested does not require an inbuilt self-testing circuit, but instead an external reference memory 6 is necessary.

The synchronous memory 1 represented in FIG. 10 has an address bus connection 7, a data bus connection 8 and a control bus connection 9. The address bus connection 7 is connected to the external testing device 9 via an external address bus 2. The data bus connection 8 of the memory chip 1 is connected to the testing device 9 via an external data bus 3, and the control bus connection 9 is connected to the testing device 9 via an external control bus 4. In addition, the integrated memory chip 1 is connected at a clock-signal input connection 10 via a clock line 11 to the testing device 9 and receives an external clock signal CLK via the clock line 11. The integrated memory chip 1 according to the invention, as represented in FIG. 10, has an internal address bus 12 for applying the address received from the testing device 9 to an internal address decoder 13. The address decoder 13 is clocked with the external clock signal CLK via an internal clock signal 114 and activates via lines 15 the memory cells within the memory cell array 16 addressed by means of the address.

The integrated memory 1 also has an internal data bus 17, which exchanges via a data input/output circuit 18, which contains inter alia the read amplifiers, and lines 19 with the cell array 16. The data input/output circuit 18 is likewise clocked with the clock signal via the internal clock line 14.

The integrated memory chip 1 also contains an internal controller 20, which is connected via an internal control bus 21 to the control bus connection 9 and exchanges control signals with the external testing device.

The internal controller 20 applies control signals to memory cells 16 via control lines 22. The integrated synchronous memory chip 1 operates at a very high operating clock frequency and contains a frequency multiplying circuit for increasing the clock frequency of the applied external clock signal.

The memory chip 1 also has a first self-testing circuit 23, for testing the functionality of the memory cell array 16. The first self-testing circuit 23 generates addresses of memory cells to be tested within the memory cell array 16 and addresses the latter via the internal address bus 12 and the address decoder 13. Subsequently, the test data are applied via the internal data bus to the data input/output circuit 18, which writes the generated test data into the addressed memory cells. Subsequently, the data are read out again from the addressed memory cells and compared with the originally generated test data by the first self-testing circuit 23. If the generated test data are identical to the data written in and out, the internal self-testing circuit 23 establishes the functionality of the memory cell array 16 and announces this to the testing device 9 via the memory bus 4.

Apart from the first self-testing circuit 23, for testing the functionality of the addressable memory cells within the memory cell array 16, the synchronous memory 1 according to the invention contains a further second self-testing circuit 24, for testing the functionality of the high-frequency data exchange between the memory chip 1 and any desired external circuit.

Figure 11:
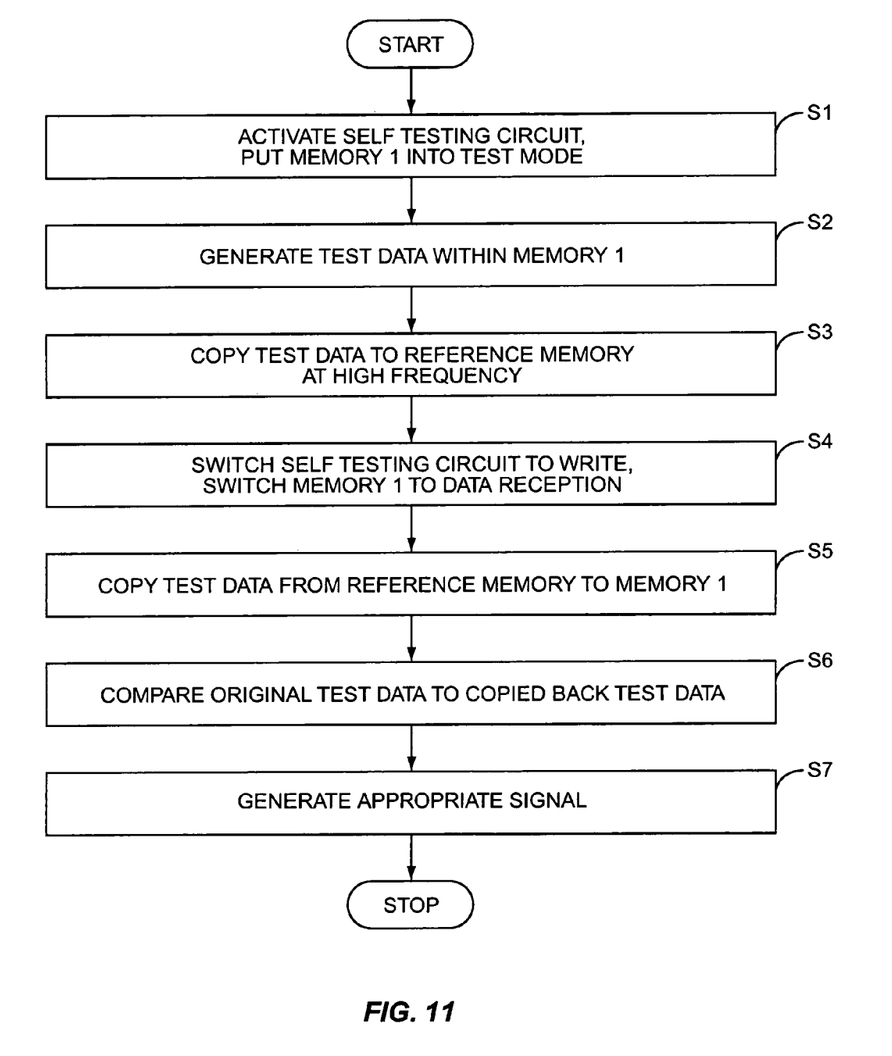
FIG. 11 shows a sequence diagram of a second embodiment of the test method according to the invention.

FIG. 11 shows a sequence diagram of the test procedure according to the invention in the case of the testing arrangement represented in FIG. 10.

In a step S1, the external testing device 5 activates the second self-testing circuit 24 via the control bus 4 and puts the memory chip 1 to be tested into a test mode. Subsequently, the testing device 5 switches itself into a standby operating mode and the further testing operation is controlled by the second self-testing circuit 24 of the memory chip 1.

In a step S2, test data are generated in a test generator within the integrated memory chip 1, the test-data generator being located for example within the first self-testing circuit 23 or the second self-testing circuit 24. The second self-testing circuit 24, for testing the data exchange functionality, activates the test-data generator and switches the reference memory 6 over to reading operation.

Subsequently, in a step S3, the generated test data are copied under the control of the self-testing circuit 24 from the test-data generator, which is located within the memory chip 1, to the reference memory 6 via the data bus 3 at a high data exchange rate, which corresponds to the high operating clock frequency of the memory chip 1 to be tested.

In a step S4, the self-testing circuit 24 switches the reference memory 6 over to writing operation and the memory chip 1 to be tested to data reception.

In a step S5, the test data copied in the reference memory 6 are copied back at the high data transfer rate via the data bus 3 to the memory 1 to be tested.

In a step S6, the originally generated test data are compared with the copied-back test data by self-testing circuit 24. If the data are identical, it is established that the memory chip 1 is functional.

If the generated test data and copied-back test data deviate, the second self-testing circuit 24 detects this and generates a signal indicating that the memory chip 1 is defective. This indicating signal is emitted by the second self-testing circuit 24 via the control bus 3 to the external testing device 9. One advantage here is that the two copying operations are performed under the control of the integrated self-testing circuit 24. The testing device 9 merely activates the self-testing operation and receives the result of the self-testing operation.

Figure 12:
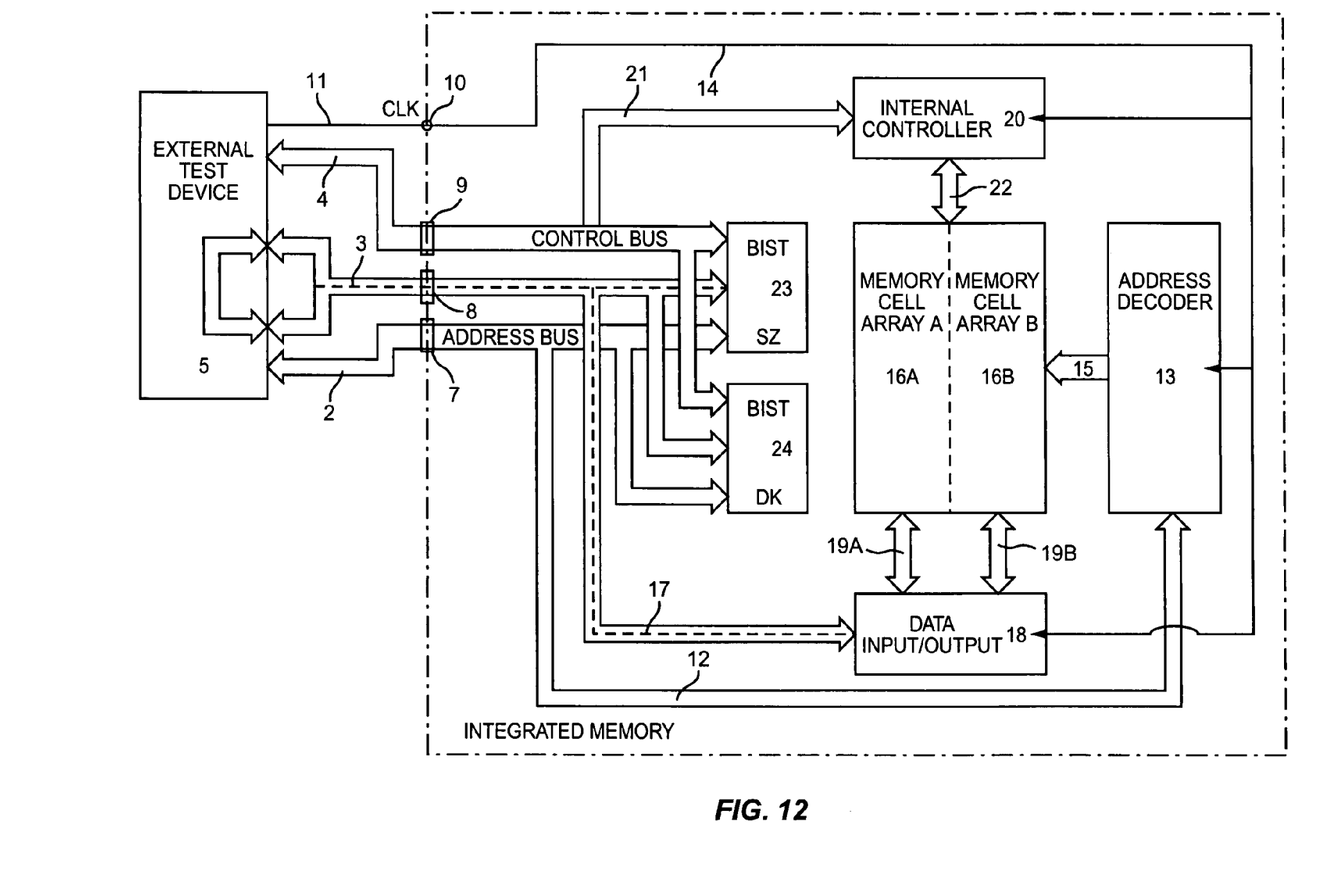
FIG. 12 shows a further embodiment of the integrated memory according to the invention with a self-testing function.
Figure 13:
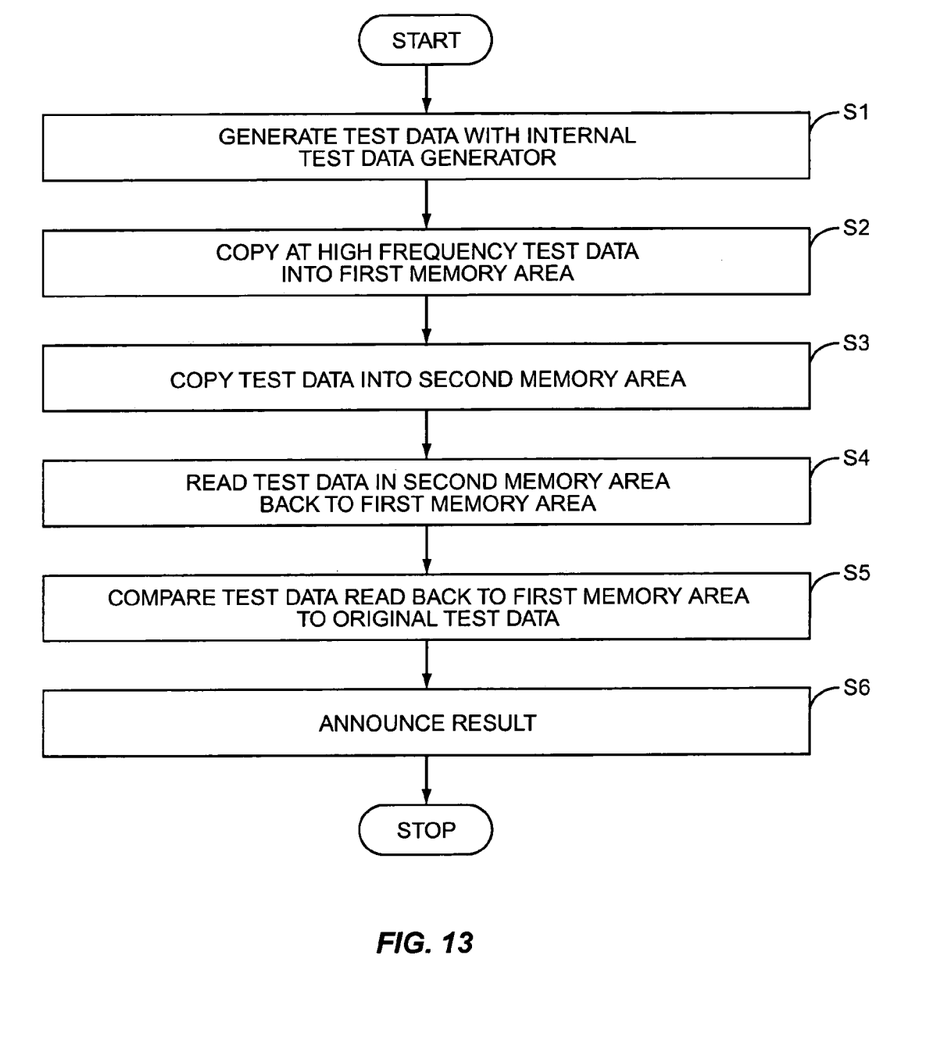
FIG. 13 shows a sequence diagram of a third embodiment of the method according to the invention for testing the data exchange functionality of a memory.

FIG. 13 shows a sequence diagram of a third embodiment of the test method according to the invention for the memory represented in FIG. 12. In a step S1, the test data are generated by an internal test-data generator within the memory 1 to be tested, which is located for example within the second self-testing circuit 24. In a further step S2, the generated test data are copied at the high operating clock frequency via the internal data bus 17 and the data input/output circuit 18 into a first memory area 16A of the memory chip 1 to be tested.

In a further step, the copied test data are copied via the internal data bus 17 and the external data bus 3 via the testing device 9 at a high data transfer rate in the second memory area 16B of the memory cell array 16 of the memory 1 to be tested. The test data copied into a second memory area 16B are read out again in a subsequent step S4, copied back via the internal data bus 17, the external data bus 3 and the testing device 9 into the first memory area 16A at the high data transfer rate.

The test data copied back and forth are read out in a further step S5 and compared with the generated test data.

If the generated test data do not coincide with the copied test data, the testing circuit 24 announces via the control bus 4 to the external testing device 9 that the memory chip 1 is not functional in a step S6. The external testing device 9 activates the test procedure and receives the test result. The test data comparison is performed within the integrated memory chip 1 by the self-testing circuit 24.

List of designations

| | |
|---|---|
| 1 | memory to be tested |
| 2 | address bus |
| 3 | data bus |
| 4 | control bus |
| 5 | external testing device |
| 6 | reference memory |
| 7 | address bus connection |
| 8 | data bus connection |
| 9 | control bus connection |
| 10 | clock connection |
| 11 | clock line |
| 12 | internal address bus |
| 13 | address decoder |
| 14 | internal clock line |
| 15 | lines |
| 16 | memory cell array |
| 17 | internal data bus |
| 18 | data input/output circuit |
| 19 | data lines |
| 20 | internal controller |
| 21 | internal control bus |
| 22 | lines |
| 23 | first self-testing circuit |
| 24 | second self-testing circuit |

The invention claimed is:

1. A method of testing functionality of a memory which operates at a high operating clock frequency, comprising:
generating test data to form generated test data, wherein said generating occurs within an external testing device;
writing at a low operating clock frequency said generated test data into at least one reference memory to form first test data;
copying the first test data from the at least one reference memory to at least one memory to be tested at the high operating clock frequency to form copied test data, wherein the at least one reference memory is outside of the at least one memory to be tested and the external testing device;
reading the copied test data from the at least one memory to be tested at the low operating clock frequency, said reading done by the external testing device;
comparing the copied test data with the generated test data, said comparing done by the external testing device; and
indicating, through a functionality-indicating signal, the functionality of the at least one memory to be tested if the copied test data are identical to the generated test data.

2. The method of claim 1, further comprising:
generating second test data with the external testing device;
writing the second test data at the low operating clock frequency into the at least one memory to be tested to form written second test data;
copying the written second test data from the at least one memory to be tested into the at least one reference memory, said copying occurring at the high operating clock frequency and forming copied second test data;
reading the copied second test data from the at least one reference memory at the low operating clock frequency, said reading performed by said external testing device to form read second test data; and
comparing, with the external testing device, the second test data generated by the external testing device with the read second test data.

3. The method of claim 2, wherein indicating, through the functionality-indicating signal, the functionality of the at least one memory to be tested comprises indicating, through the functionality-indicating signal, the functionality of the at least one memory to be tested if the second test data are identical to the read second test data.

4. The method of claim 1 further comprising delaying an adjustable time delay before copying the first test data to the at least one memory to be tested.

5. The method of claim 1 wherein writing said generated test data into the at least one reference memory comprises writing into a reference memory distinct from the external testing device.

6. A method of testing functionality of a memory which operates at a high operating clock frequency, comprising:
- generating test data to form generated test data, wherein said generating occurs within an internal test-data generator within at least one memory to be tested;
- writing said generated test data into a reference memory to form first test data, wherein the reference memory is outside of the at least one memory to be tested;
- copying the first test data from the reference memory to the at least one memory to be tested at the high operating clock frequency to form copied test data;
- comparing the copied test data with the generated test data, said comparing done by a comparison circuit within the at least one memory to be tested; and
- indicating, through a functionality-indicating signal, the functionality of the at least one memory to be tested if the copied test data are identical to the generated test data.

7. The method of claim 6 wherein indicating, through the functionality-indicating signal, the functionality of the memory, comprises emitting with the comparison circuit, the functionality-indicating signal.

8. The method of claim 6 further comprising delaying an adjustable time delay before copying the first test data to the at least one memory to be tested.

9. A method of testing functionality of a memory which operates at a high operating clock frequency, comprising:
- generating test data to form generated test data, wherein said generating occurs within an internal test-data generator within the memory;
- writing said generated test data into a first memory area of the memory to form first test data;
- copying the first test data from the first memory area into a second memory area of the memory at the high operating clock frequency to form copied test data;
- reading the copied test data from the second memory area, said reading done by a comparison circuit within the memory;
- comparing the copied test data with the generated test data, said comparing done by the comparison circuit; and
- generating a functionality-indicating signal if the copied test data and the generated test data are identical.

10. The method of claim 9 wherein generating the functionality-indicating signal is performed by the comparison circuit.

11. The method of claim 9 further comprising delaying an adjustable time delay before copying the first test data to the memory.

12. An integrated synchronous memory, comprising:
- a multiplicity of addressable memory cells for connecting to an external circuit;
- a first self-testing circuit for testing functionality of the multiplicity of addressable memory cells;
- a second self-testing circuit for testing functionality of a high-frequency data exchange between the integrated synchronous memory and the external circuit; and
- a test generator for generating test data for testing the functionality of the memory cells.

* * * * *